United States Patent [19]

Smears

[11] Patent Number: 5,684,304
[45] Date of Patent: Nov. 4, 1997

[54] STRUCTURE FOR TESTING INTEGRATED CIRCUITS

[75] Inventor: Nicholas William Smears, Saint Egreve, France

[73] Assignee: SGS-Thomsn Microelectronics S.A., Saint Genis, France

[21] Appl. No.: 359,459

[22] Filed: Dec. 20, 1994

[30] Foreign Application Priority Data

Dec. 27, 1993 [FR] France .................... 93 15995

[51] Int. Cl.⁶ .................................. H01L 23/58
[52] U.S. Cl. ............................ 257/48; 257/532
[58] Field of Search ............ 257/48, 532–535; 324/158.1

[56] References Cited

U.S. PATENT DOCUMENTS 4,801,867  1/1989  Suzuki ........................ 324/763
4,929,998  5/1990  Boudewijns ................ 257/532
5,420,449  5/1995  Oji ............................. 257/532

FOREIGN PATENT DOCUMENTS 63-143843  6/1988  Japan ......................... 257/532
1-233749   9/1989  Japan ......................... 257/48

*Primary Examiner*—Jerome Jackson
*Assistant Examiner*—John Guay
*Attorney, Agent, or Firm*—Wolf, Greenfield & Sacks, P.C.; James H. Morris

[57] ABSTRACT

An integrated circuit has at least one access pad connected to an element of an internal circuit through a capacitor including two opposed conductive layers insulated one from the other. The lower conductive layer portion is connected to the pad and the upper conductive layer portion is connected to the element. Thus, the upper conductive layer portion forms a d.c. current testing pad.

2 Claims, 3 Drawing Sheets

STRUCTURE FOR TESTING INTEGRATED CIRCUITS

BACKGROUND OF THE INVENTION

1. Field of the Invention

The present invention relates to integrated circuits including capacitive inputs on which it is desired to carry out d.c. current test operations.

More particularly, the present invention relates to integrated circuits in which at least some input pads are connected to internal circuits of the integrated circuit through capacitors. This is the case for integrated circuits receiving high frequency signals, for example circuits used in radiotelephone transceivers receiving very high frequency signals (e.g., signals at several hundred MHz), and especially circuits for processing intermediate frequency signals of several MHz.

2. Discussion of the Related Art

As represented in FIG. 1, an integrated circuit pad 1 is connected through a capacitor 2 to the input of an internal circuit 3 and, for example, is connected to the base 4 of a bipolar transistor.

During the fabrication of integrated circuits, the manufacturers perform many tests in order to fabricate circuits without defects. Some of these tests are carried out before the integrated circuits are encapsulated or passivated by applying a passivation layer on the upper surface of the chip. Furthermore, the chip may not yet be separated from the other chips of the same wafer. Conductive pins or whiskers may not yet be provided to receive test signals. In the case of the pad of FIG. 1, it is desired, during the tests, to apply d.c. signals to the internal circuits to study the performance of those circuits. For this purpose, an additional port, for example a terminal 5 corresponding to an additional pad, is conventionally provided.

FIG. 2A is a top view of a conventional embodiment of the portion of the integrated circuit illustrated in FIG. 1 including the input pad 1, the capacitor 2, the connection to the internal circuit 3 and the test pad 5. The capacitor is realized by superposing two conductive layers separated by an insulating layer.

As represented in the cross-sectional view of FIG. 2B, the structure of FIG. 2A is disposed over a substrate 10 in which implantation and diffusion steps are carried out to form the integrated circuit components. Substrate 10 is coated with a first insulating layer 11, usually silicon oxide, entirely coating the substrate except on the areas where connections with portions of selected layers have to be established. For example, the right lower portion of the drawing schematically represents an NPN transistor structure for which a base contact 4 corresponding to the input of the circuit 3 shown in FIG. 1 is established. In the given example, a first conductive layer 12 is formed on the insulating layer 11 and is etched to form the lower electrode of capacitor 2 and the connection to the base contact region 4 of the NPN transistor. The first conductive layer 12 is coated with a second insulating layer 13 that may be planarized. In FIG. 2B, layer 13 is not planarized. A second conductive layer 14 is then deposited on the insulating layer 13 and is etched to form the upper electrode of capacitor 2. Portions of this conductive layer 14 could also be used to form pads. However, in the given example, the conductive layer 14 is represented as coated with a third insulating layer 15 which is planarized, in turn coated with a third conductive layer 16 whose portions are used to form pads 1 and 5. Pad 1 is connected through a via 17 to an extension of the portion of the second level conductive layer 14 used to form the upper electrode of the capacitor. Similarly, pad 5 (not represented in FIG. 2B) is connected through a via (not shown) to an extension of the lower electrode layer of the capacitor. Generally, in integrated circuits designed to process high frequency signals, the third conductive layer is also applied over a very large portion 18 that coats a substantial portion of the structure, forming a shield. Portion 18 may be connected to a ground pad for example.

This type of structure is very commonly and conventionally used.

In a chip of an integrated circuit, a substantial fraction of the chip surface is occupied by connection pads. Indeed, the size of the elementary elements of an integrated circuit is conventionally a few $\mu m^2$, whereas a pad, to allow welding or test steps to be carried out, has a size of approximately some tens of thousands of a $\mu m^2$ (for example 100 $\mu m \times 100$ $\mu m$). Accordingly, manufacturers of integrated circuits constantly try to reduce the number of integrated circuit pads required. More particularly, it is desired to reduce as much as possible the number of pads that are used only for tests and that are not used subsequently to connect the circuit to other circuits in an end use.

In the above described conventional structure, it can be seen that a pad 5 to apply d.c. signals on the base of an NPN transistor base through a test pin is used, because the connection to the transistor base cannot be accessed for the three following reasons:

the connection is too narrow to receive a test pin, the connection is in a buried conductive layer level and is coated with insulating layers, and the connection is coated with a shielding layer.

Accordingly, such additional test pads 5 have always been used to perform tests of integrated circuits with capacitive inputs where access by test pins is required.

SUMMARY OF THE INVENTION

An object of the present invention is to reduce the surface area occupied by integrated circuits of the above mentioned general type.

A more particular object of the present invention is to allow for testing the above mentioned integrated circuits without using dedicated test pads.

To achieve these objects, the present invention provides, as an upper electrode, the electrode connected to the internal circuit connections, and, as a lower electrode, the electrode connected to the input pad. It is therefore possible to carry out the test by using the upper electrode of the capacitor as a pin testing pad to supply d.c. current test signals. If a shielding layer is provided, it is interrupted about the input capacitor, and the portion positioned over the input capacitor is connected to the upper electrode of the capacitor. This structure is in contrast to that of the prior art, in which the number and lengths of vias are minimized by connecting the upper electrode to the input pad and the lower electrode to the internal circuit.

More particularly, the present invention provides an integrated circuit having at least one access pad connected to an element of an internal circuit through a capacitor constituted by two facing portions of conductive layers insulated one with respect to the other. The portion of the lower conductive layer is connected to the pad and the portion of the upper conductive layer is connected to the above-mentioned element.

The portion of the upper conductive layer forms a test pad.

According to one embodiment of the present invention, the portion of the lower conductive layer is made of polycrystalline silicon and the portion of the upper conductive layer corresponds to a first metallization level. The portion of the conductive layer constituting the upper electrode of the capacitor is preferably coated with an insulating layer and with a portion of a third conductive layer connected with the electrode through vias across the insulating layer.

According to another embodiment of the present invention, the portion of the lower conductive layer is made of polycrystalline silicon and the portion of the upper conductive layer corresponds to a diffused region connected to a portion of a layer of a first metallization level. Preferably, the portion of the first metallization level is coated with a portion of a conductive layer of a second metallization level connected to the portion of the first metallization.

The foregoing and other objects, features, aspects and advantages of the invention will become apparent from the following detailed description of the present invention when taken in conjunction with the accompanying drawings.

As is conventional, the various drawings representing portions of integrated circuits are not drawn to scale. In particular, the size of the various elements is arbitrarily contracted or enlarged to facilitate legibility of the drawings.

DETAILED DESCRIPTION

Figure 1:
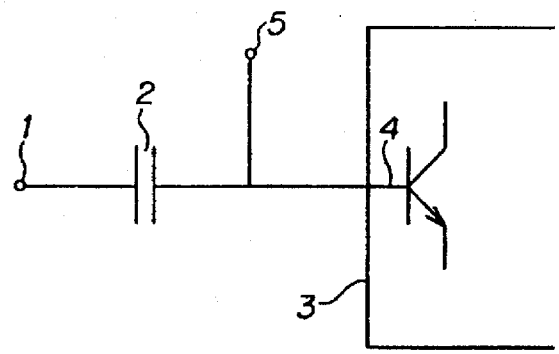
FIG. 1, described above, is a schematic drawing of a capacitive input to an integrated circuit.
Figure 2A:
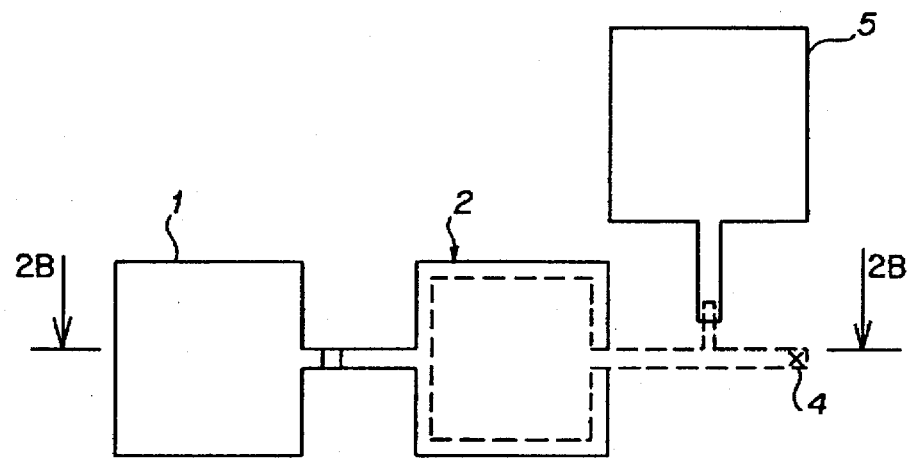
FIGS. 2A and 2B, described above, are a top view and a schematic cross-sectional view, respectively, of a portion of a conventional integrated circuit corresponding to FIG. 1.
Figure 2B:
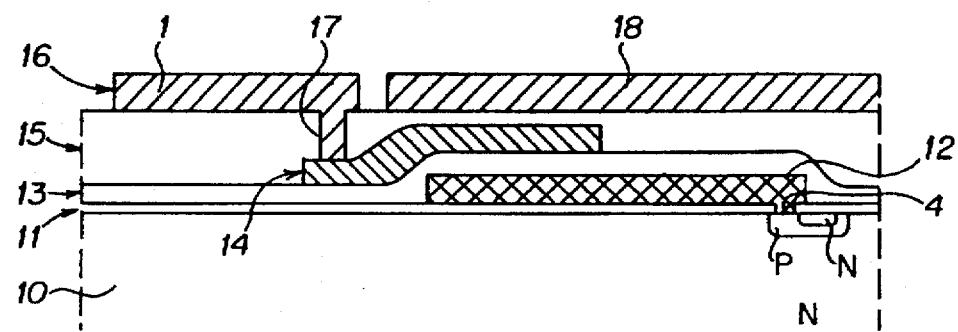
Figure 3A:
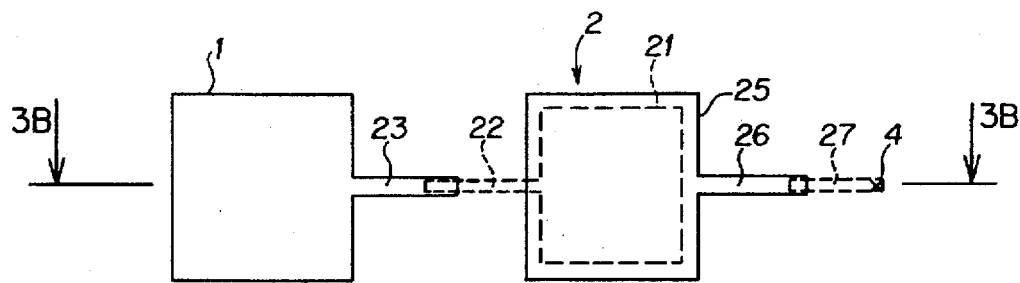
FIG. 3 is a top view of an embodiment according to the invention of a portion of an integrated circuit.
Figure 3B:
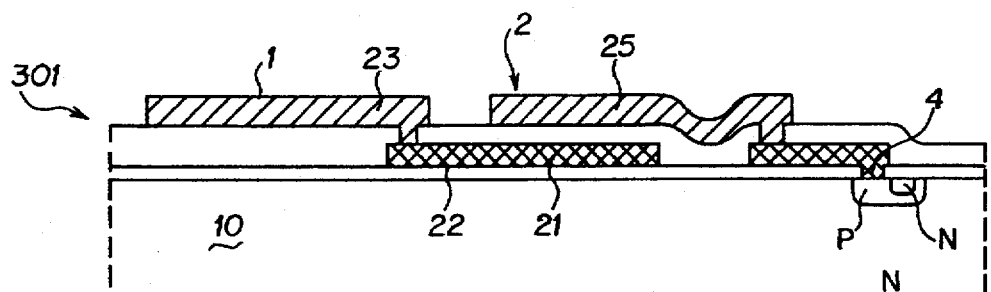

FIG. 3 is a top view of an embodiment according to the invention of an integrated circuit pad 1 connected through a capacitor 2 to an access contact 4 of a component of an integrated circuit, for example the base of an NPN transistor.

Capacitor 2 is disposed so that its lower electrode 21 is connected through an extension 22 to an extension 23 of pad 1. The upper electrode 25 of capacitor 2 is connected through an extension 26 to the access contact 4 of the component or alternatively to a portion of another conductive layer 27 connected to contact 4.

Conventionally, electrode 21 corresponds to a first conductive layer level, for example a polysilicon layer; electrode 25 corresponds to a second conductive layer level, for example a first metallization level; and pad 1 corresponds to a third conductive layer level, for example a second metallization level. Of course, various modifications can be made to the above embodiment. For example, as shown in FIG. 3, the capacitor can be disposed across the first and second metallization levels, and the pad can correspond to the same metallization level as the metallization level of the upper electrode.

With this configuration, as shown if FIG. 3, and due to the fact that an upper metallization level is selected for the capacitor electrode 25 connected to access contact 4 of at least one internal component of the integrated circuit, the upper electrode can be directly used as a test pad.

If electrode 25 is disposed in a portion of an upper conductive layer which is not the uppermost conductive layer of the integrated circuit, this uppermost conductive layer may be apertured above the upper electrode to allow the use of this upper electrode as a test pad.

Figure 4A:
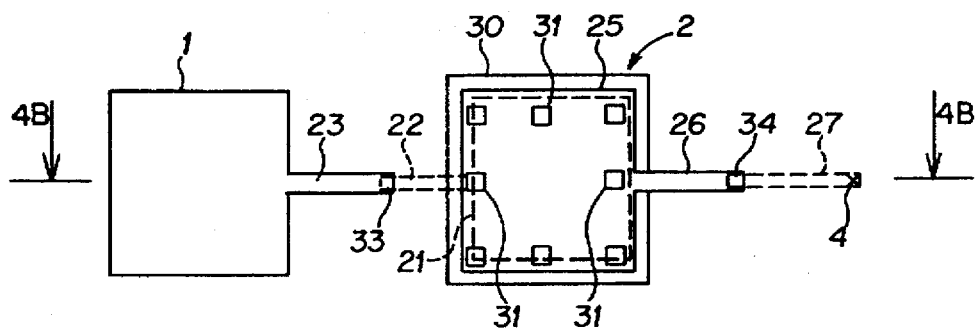
FIGS. 4A and 4B are a top view and a schematic cross-sectional view, respectively, of another embodiment of a portion of an integrated circuit according to the invention.
Figure 4B:
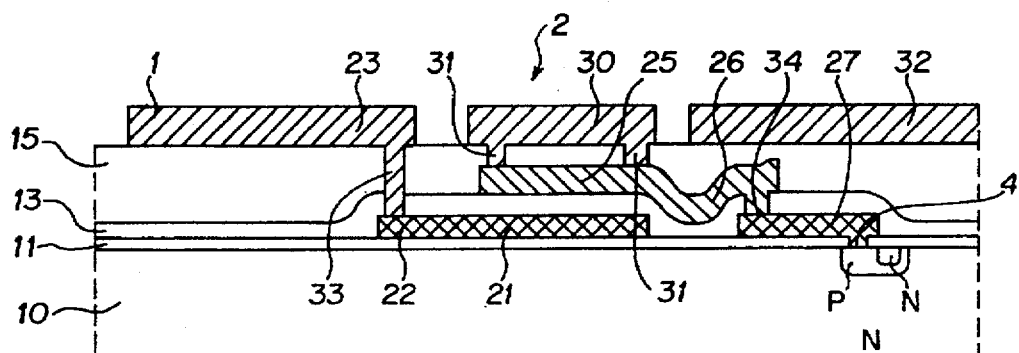

According to another embodiment of the present invention, illustrated as a top view in FIG. 4A and as a cross-sectional view in FIG. 4B, the lower electrode of the capacitor is formed by a portion of a polycrystalline silicon conductive layer, and the upper electrode is a portion of a first metallization level conductive layer. The upper electrode is in turn coated with a substantially conforming portion of a second metallization level which is connected to the upper electrode.

More particularly, FIG. 4A represents the input pad 1. An extension of pad 1 serves as a connection 23 and is connected by via 33 to an extension that serves as a connection 22 of a polycrystalline silicon layer portion 21 constituting the lower electrode of the capacitor. A portion 25 of a first metallization level coats the electrode 21 while being insulated therefrom by insulating layer 13 and extends through extension 26 and via 34 to an extension 27 of a polycrystalline silicon connection providing contact with access 4. An upper metallization layer 30 forming a portion of a second metallization level is connected to the upper electrode 25 through vias 31.

The above mentioned elements are shown in FIG. 4B which is a cross-sectional view along line B—B of FIG. 4A. The elements are formed over a substrate 10 including first, second and third insulating layers 11, 13 and 15. FIG. 4B further shows an additional layer portion 32 of the second metallization level used as an electromagnetic shield for the whole integrated circuit except for the pad regions and upper regions of the capacitor. One advantage of such a structure is to increase the mechanical strength of the integrated circuit with respect to the pressure applied by a test pin on the capacitor through layer 30.

Figure 5:
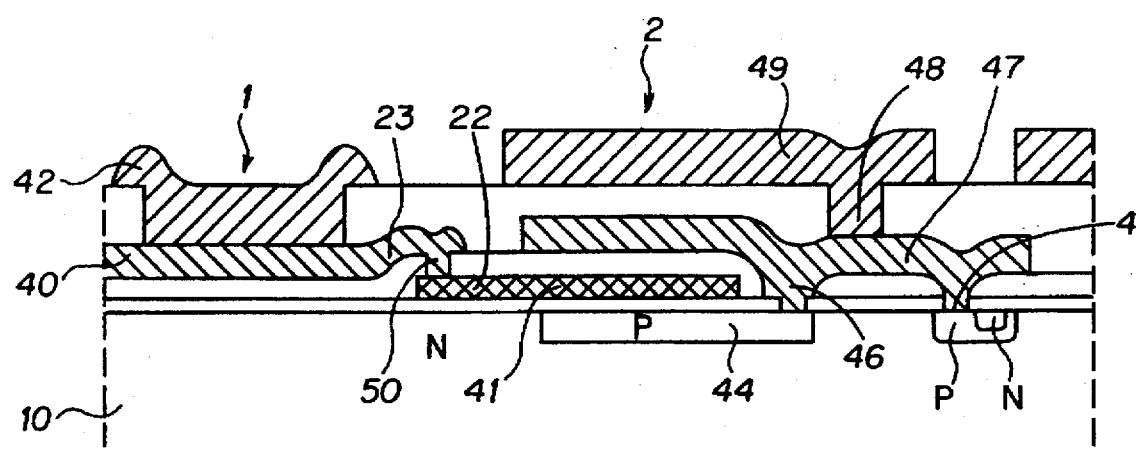
FIG. 5 is a schematic cross-sectional view of yet another embodiment of a portion of an integrated circuit according to the invention.

According to another embodiment of the present invention, shown in the cross-sectional view of FIG. 5, the lower electrode of the capacitor is formed by a diffused region. The upper electrode is formed by a portion of a polycrystalline silicon conductive layer, and is in turn coated with substantially conforming portions of the conductive layers of first and second metallization levels connected to the upper electrode. Thus, the lower electrode of the capacitor is connected to the uppermost electrode of the circuit.

More particularly, in FIG. 5, the input pad 1 is formed by a portion 40 of a first metallization level. Portion 40 is provided with an extension 23 connected through via 50 to an extension 22 of a portion 41 of the polycrystalline silicon layer constituting a first electrode of the capacitor. The portion 40 of the first metallization level is coated with a portion 42 of the second metallization level to form pad 1 In substrate 10, a diffused fused region 44 is disposed beneath the portion 41 of the polycrystalline silicon layer and forms the second electrode of the capacitor. Region 44 is connected through a via 46 with a portion 47 of a first metallization level. Portion 47 extends to an access 4 to the integrated circuit. An uppermost metallization 49 formed of a portion of the second metallization level is connected through vias 48 to portion 47 to form a test pad.

Usually, the input capacitors positioned between the access pads and internal circuits of an integrated circuits have values of approximately 10 nF and have the shape of squares having a side length of 50 to 100 μm.

As is apparent to those skilled in the art, various modifications can be made to the above disclosed embodiment.

The present invention has been disclosed with reference to bipolar integrated circuits. The invention also applies to BICMOS and MOS circuits. For high frequency circuits such as transceiver circuits used in radio-telephone, bipolar integrated circuit are predominantly used. In addition, although a first layer of polycrystalline silicon and first and second metallization levels have been described, the three levels of conductive layer can be made in any other way conventionally used in connection with any particular integrated circuit technology. More than three levels of conductive layers can also be used.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit having at least one access pad connected to an element of an internal circuit through a capacitor including lower conductive plate occupying a capacitor area defined thereby;

an upper conductive plate occupying the capacitor area;

a first insulation layer disposed between the lower conductive plate and the upper conductive plate;

a second insulation layer disposed on the upper conductive plate and having at least one via defined therein; and a conductive contact layer disposed on the second insulation layer, occupying the capacitor area and connected to the upper conducting plate through the via defined in the second insulation layer; and wherein the lower conductive plate is connected to the pad and the upper conductive plate is connected to said element, wherein the conductive contact layer forms a test pad, and wherein the lower conductive plate is made of polycrystalline silicon and wherein the upper conductive plate is further connected to a diffused region beneath the lower conductive plate, the diffused region connected to a portion of a first metallization level.

2. The integrated circuit of claim 1, wherein the portion of the first metallization level is coated with a portion of a conductive layer of a second metallization level connected thereto.

* * * * *

UNITED STATES PATENT AND TRADEMARK OFFICE
CERTIFICATE OF CORRECTION

PATENT NO. : 5,684,304
DATED : November 4, 1997
INVENTOR(S) : Nicholas W. Smears It is certified that error appears in the above-identified patent and that said Letters Patent is hereby corrected as shown below:

Column 6,
Claim 1, line 1, a lower conductive plate occupying a capacitor area defined Signed and Sealed this Sixth Day of January, 1998

Attest:

BRUCE LEHMAN

Attesting Officer

Commissioner of Patents and Trademarks

UNITED STATES PATENT AND TRADEMARK OFFICE

CERTIFICATE OF CORRECTION

PATENT NO. :   5,684,304

DATED      :   November 4, 1997

INVENTOR(S):   Nicholas W. Smears

It is certified that error appears in the above-identified patent and that said Letters Patent is hereby corrected as shown below:

On the title page, item [73] should read:

[73]    Assignee:    SGS-Thomson Microelectronics S.A.
                     Saint Genis, France Signed and Sealed this Seventeenth Day of February, 1998

*Attest:*

BRUCE LEHMAN

*Attesting Officer*     *Commissioner of Patents and Trademarks*